United States Patent
Chen et al.

(10) Patent No.: US 9,224,765 B2
(45) Date of Patent: Dec. 29, 2015

(54) FABRICATING METHOD OF ARRAY STRUCTURE

(71) Applicant: Au Optronics Corporation, Hsinchu (TW)

(72) Inventors: Yu-Cheng Chen, Hsinchu (TW); Chih-Hung Lin, Taoyuan County (TW); Yi-Hui Li, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/494,570

(22) Filed: Sep. 23, 2014

(65) Prior Publication Data

US 2015/0011054 A1    Jan. 8, 2015

Related U.S. Application Data

(62) Division of application No. 12/712,209, filed on Feb. 25, 2010, now Pat. No. 8,872,184.

(30) Foreign Application Priority Data

Sep. 30, 2009 (TW) ............................... 98133259 A

(51) Int. Cl.
| | |
|---|---|
| *H01L 27/12* | (2006.01) |
| *G02F 1/1339* | (2006.01) |
| *G02F 1/1345* | (2006.01) |
| *G02F 1/1368* | (2006.01) |
| *G02F 1/1362* | (2006.01) |

(52) U.S. Cl.
CPC ........ *H01L 27/1288* (2013.01); *G02F 1/13394* (2013.01); *G02F 1/13458* (2013.01); *H01L 27/1214* (2013.01); *H01L 27/1248* (2013.01); *G02F 1/1368* (2013.01); *G02F 2001/136231* (2013.01)

(58) Field of Classification Search
CPC ..................... H01L 27/14812; H01L 27/3248; H01L 27/3246; H01L 27/1248; H01L 27/1288; H01L 27/1214; G02F 1/13394; G02F 1/13458; G02F 1/1368; G02F 2001/136231
See application file for complete search history.

(56) References Cited

U.S. PATENT DOCUMENTS

| | | | | |
|---|---|---|---|---|
| 5,668,379 | A * | 9/1997 | Ono et al. ...................... | 257/59 |
| 5,879,959 | A * | 3/1999 | Chen .............................. | 438/30 |
| 2004/0232424 | A1* | 11/2004 | Hotta et al. ..................... | 257/72 |
| 2005/0110915 | A1* | 5/2005 | Lee et al. ........................ | 349/43 |
| 2006/0108587 | A1* | 5/2006 | Lee et al. ........................ | 257/72 |
| 2006/0119771 | A1* | 6/2006 | Lim et al. ..................... | 349/114 |
| 2007/0152220 | A1* | 7/2007 | Kwack ........................... | 257/59 |
| 2009/0289257 | A1* | 11/2009 | Sakurai .......................... | 257/59 |
| 2010/0055850 | A1* | 3/2010 | Chiang et al. ................. | 438/155 |
| 2011/0111543 | A1* | 5/2011 | Ono ................................ | 438/42 |

* cited by examiner

*Primary Examiner* — Latanya N Crawford
(74) *Attorney, Agent, or Firm* — Jianq Chyun IP Office

(57) ABSTRACT

An array structure, which includes a TFT, a passivation layer, a pixel electrode, a first connecting layer and a first spacer is provided. The TFT includes a gate, a source and a drain. The passivation layer overlays the TFT. The pixel electrode is located on the passivation layer. The first connecting layer is located on the pixel electrode and electrically connected to the pixel electrode and the drain. The first spacer is located on the first connecting layer.

10 Claims, 11 Drawing Sheets

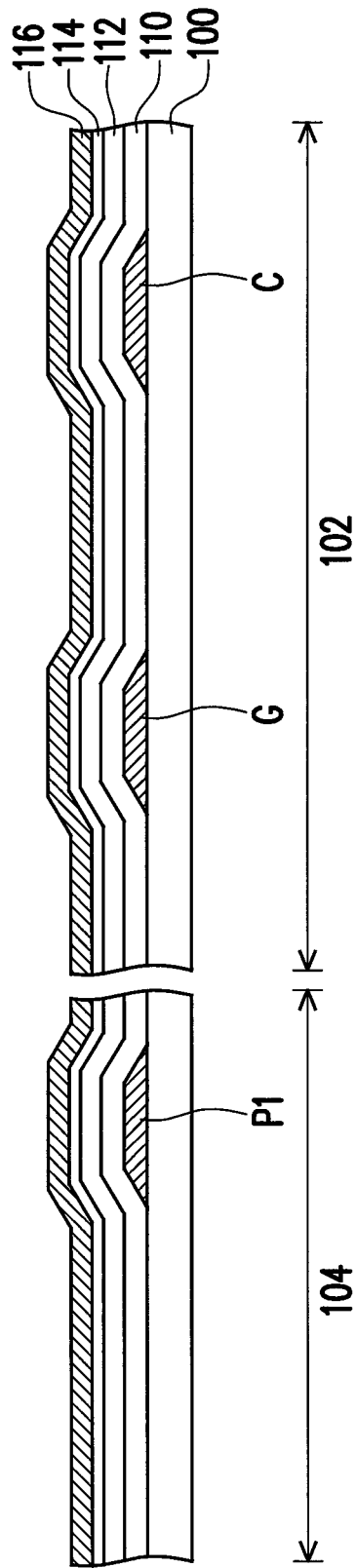
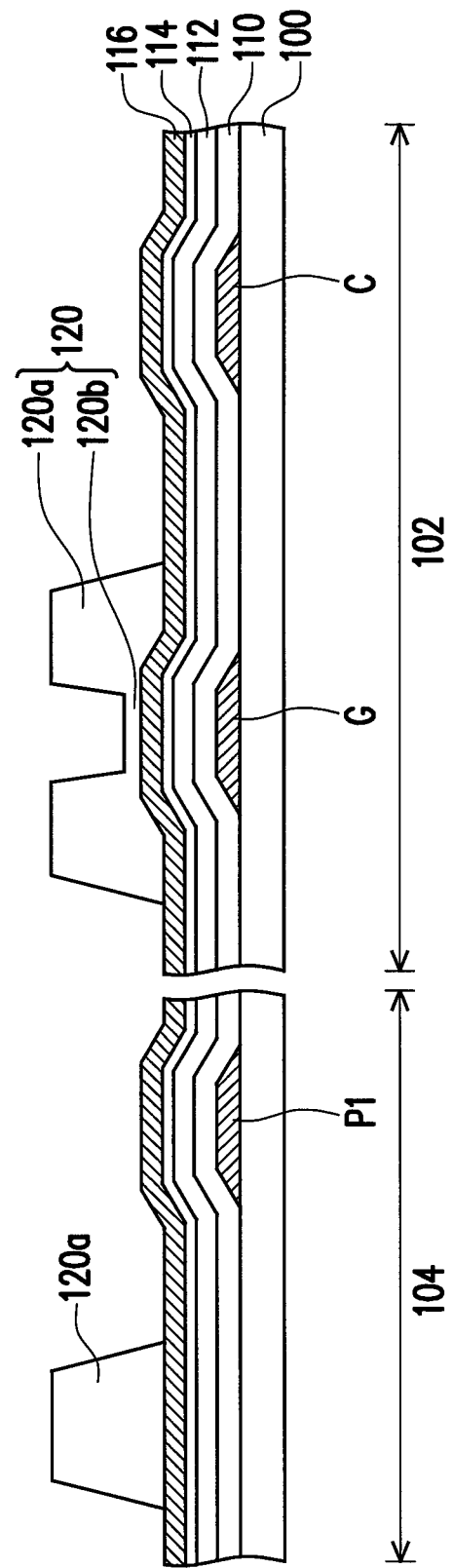

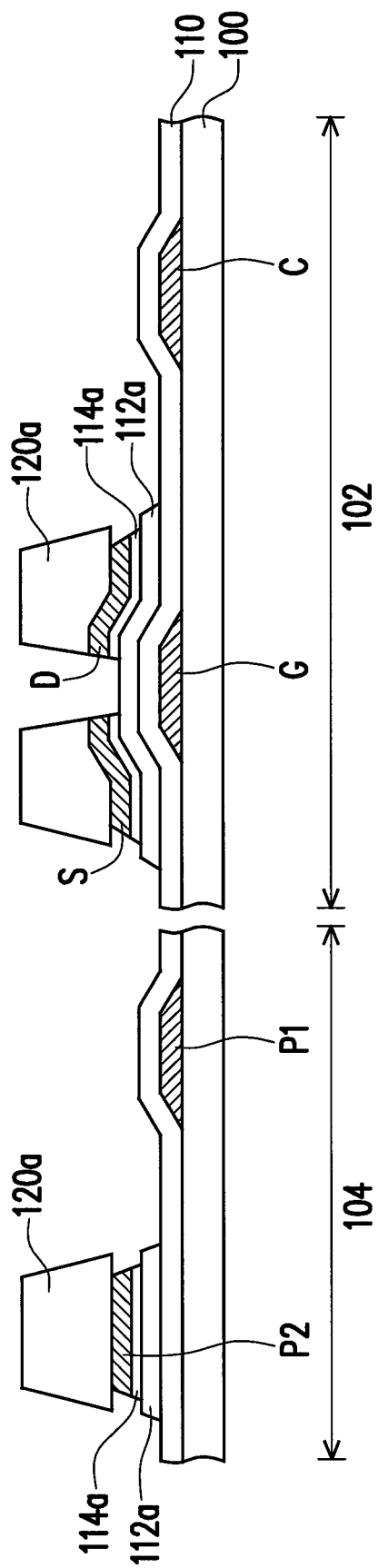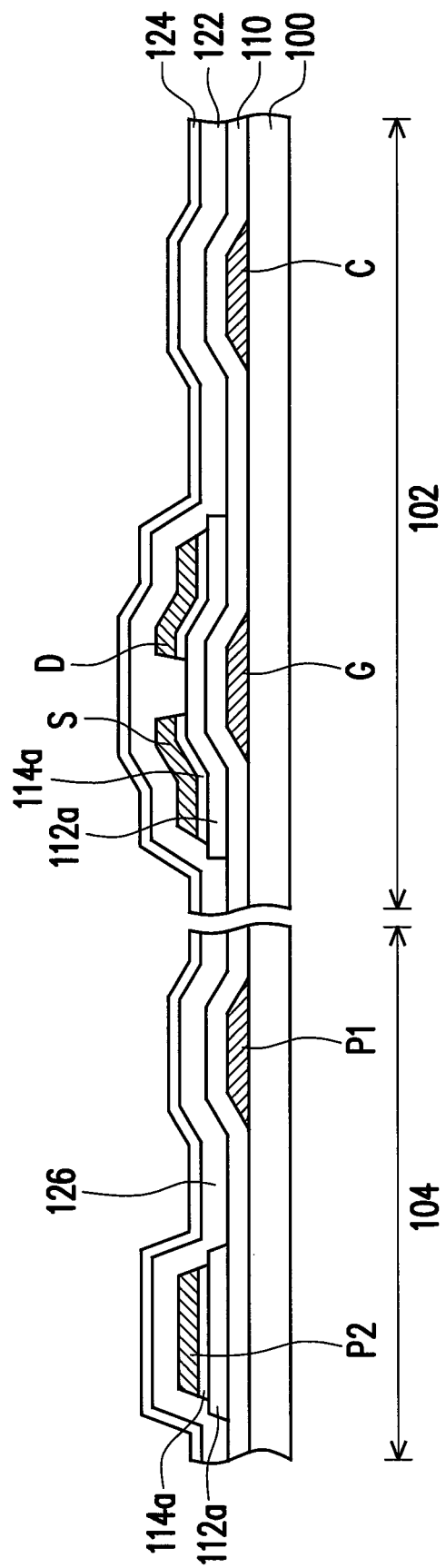

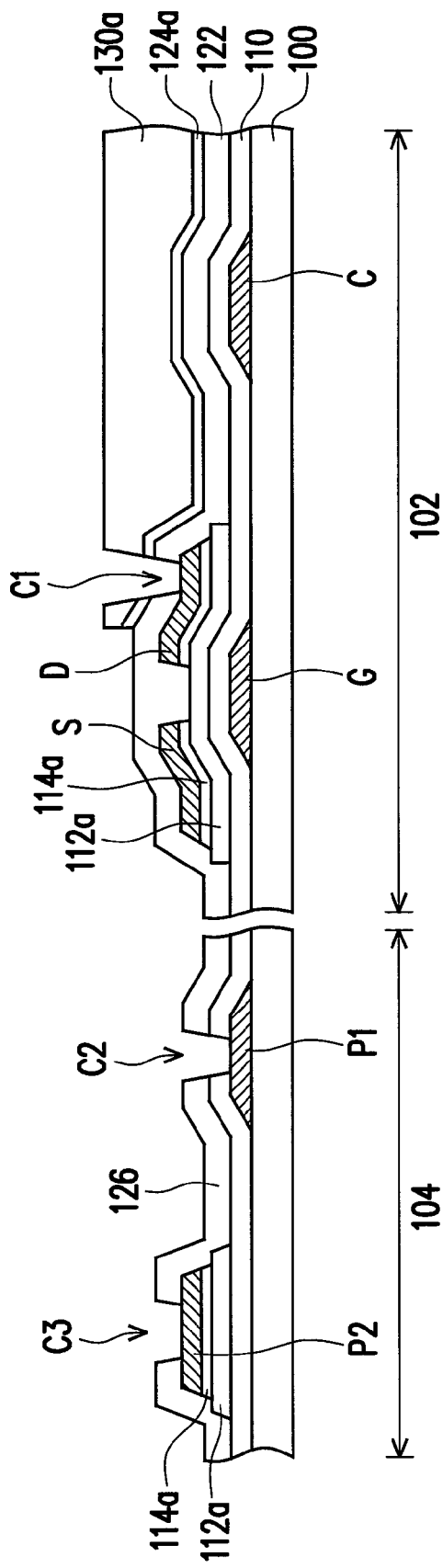
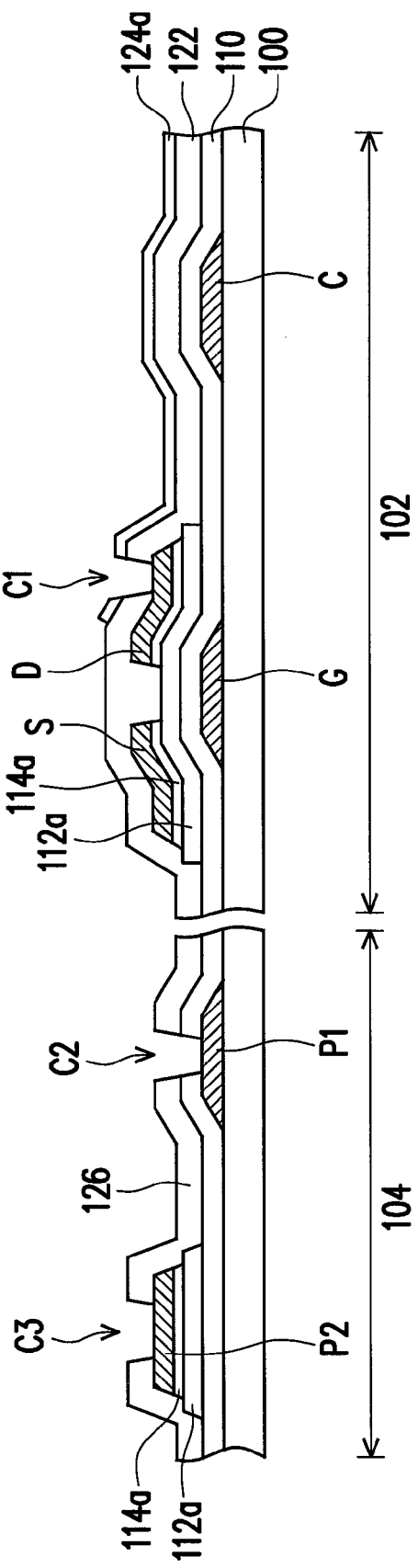
FIG. 1J
FIG. 1K

FABRICATING METHOD OF ARRAY STRUCTURE

CROSS-REFERENCE TO RELATED APPLICATION

This is a divisional application of patent application Ser. No. 12/712,209, filed on Feb., 25, 2010, which claims the priority benefit of Taiwan application serial no. 98133259, filed on Sep. 30, 2009. The entirety of each of the above-mentioned patent applications is hereby incorporated by reference herein and made a part of specification.

BACKGROUND OF THE INVENTION

1. Field of the Invention

The present invention generally relates to an array structure and a fabricating method thereof, and more particularly, to an array structure and a fabricating method thereof related to a liquid crystal display panel (LCD panel).

2. Description of Related Art

The LCD is advantageous in high display quality, small size, light weight, low driving voltage, low power consumption and wide application spectrums, so that it has substituted the cathode ray tube (CRT) to have played a major role on the mainstream market of the new display generation. A traditional LCD panel comprises a color filter substrate, a thin film transistor array substrate (TFT array substrate) and a liquid crystal layer disposed between the above-mentioned two substrates. Generally, a plurality of pixel structures are disposed on the TFT array substrate, and a plurality of filter units corresponding to the above-mentioned pixel structures are disposed on the color filter substrate, wherein in order to keep a certain space between the color filter substrate and the TFT array substrate, a plurality of spacers are usually employed and disposed between the above-mentioned two substrates.

In a currently available LCD, the spacers are normally formed on the color filter substrate. After that, the two substrates are assembled so that the two ends of the spacers respectively contact the two surfaces of the two substrates and the required space between the two substrates is accordingly kept. To form the above-mentioned spacers on the color filter substrate, an additional photomask is usually required to form the spacers.

If the fabricating process of the spacers is integrated into the fabrication process of the TFT array substrate, the photomask for forming the spacers in the fabricating process of the color filter substrate can be saved, which is advantageous in reducing the cost.

SUMMARY OF THE INVENTION

Accordingly, the present invention is directed to a fabricating method of an array structure and an array structure fabricated by the method, which features to integrate the fabricating process of the spacers into the fabrication process of the TFT array substrate, so as to save the photomask for forming the spacers in the fabricating process of the color filter substrate.

The present invention provides an array structure, which includes a TFT, a passivation layer, a pixel electrode, a first connecting layer and a first spacer. The TFT includes a gate, a source and a drain. The passivation layer overlays the TFT. The pixel electrode is located on the passivation layer. The first connecting layer is located on the pixel electrode and electrically connected to the pixel electrode and the drain. The first spacer is located on the first connecting layer.

The present invention also provides a fabricating method of an array structure. The method includes forming a TFT on a substrate, wherein the TFT includes a gate, a source and a drain. Next, a passivation layer and a pixel electrode material layer are sequentially formed to overlay the TFT. Then, a first contacting opening is formed in the pixel electrode material layer and the passivation layer to expose the drain, followed by patterning the pixel electrode material layer to define a pixel electrode. After that, a connecting material layer is formed to overlay the pixel electrode and fills into the first contacting opening. Further, a first spacer is formed on the connecting material layer, wherein the first spacer is correspondingly disposed over the first contacting opening. Finally, the first spacer serves as a mask to remove the portion of the connecting material layer which is not covered by the first spacer, so as to form a first connecting layer and the pixel electrode is electrically connected to the drain.

The present invention is able to integrate the spacers into the fabricating process of the array structures without increasing the quantity of the photomasks required for fabricating the original array structures. In other words, the method of the present invention can save the photomask for forming the spacers in the conventional fabricating process of the color filter substrate, so that the present invention is advantageous in reducing the quantity of the employed photomasks and reducing the fabricating cost.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The accompanying drawings are included to provide a further understanding of the invention, and are incorporated in and constitute a part of this specification. The drawings illustrate embodiments of the invention and, together with the description, serve to explain the principles of the invention.

Figure 1C:
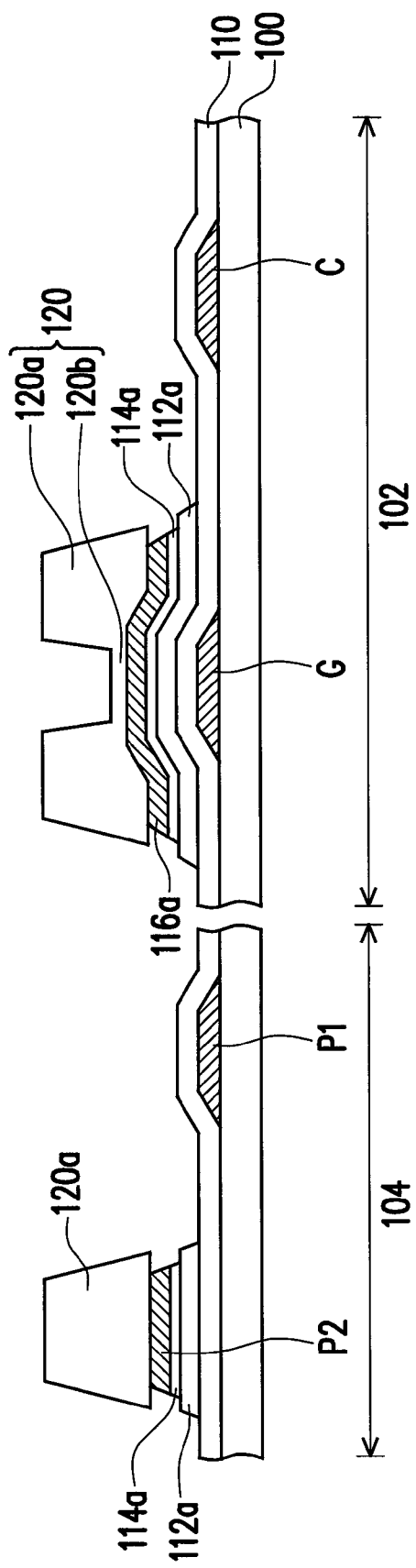
FIGS. 1A-1N are cross-section diagrams showing the fabricating flowchart of an array structure according to an embodiment of the present invention.
Figure 1D:
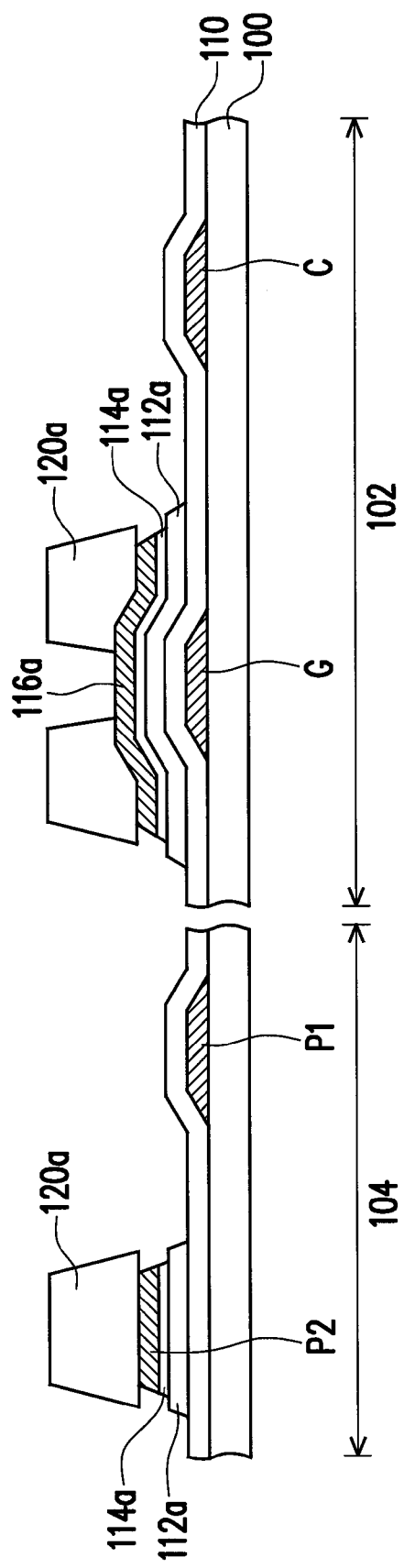
Figure 1G:
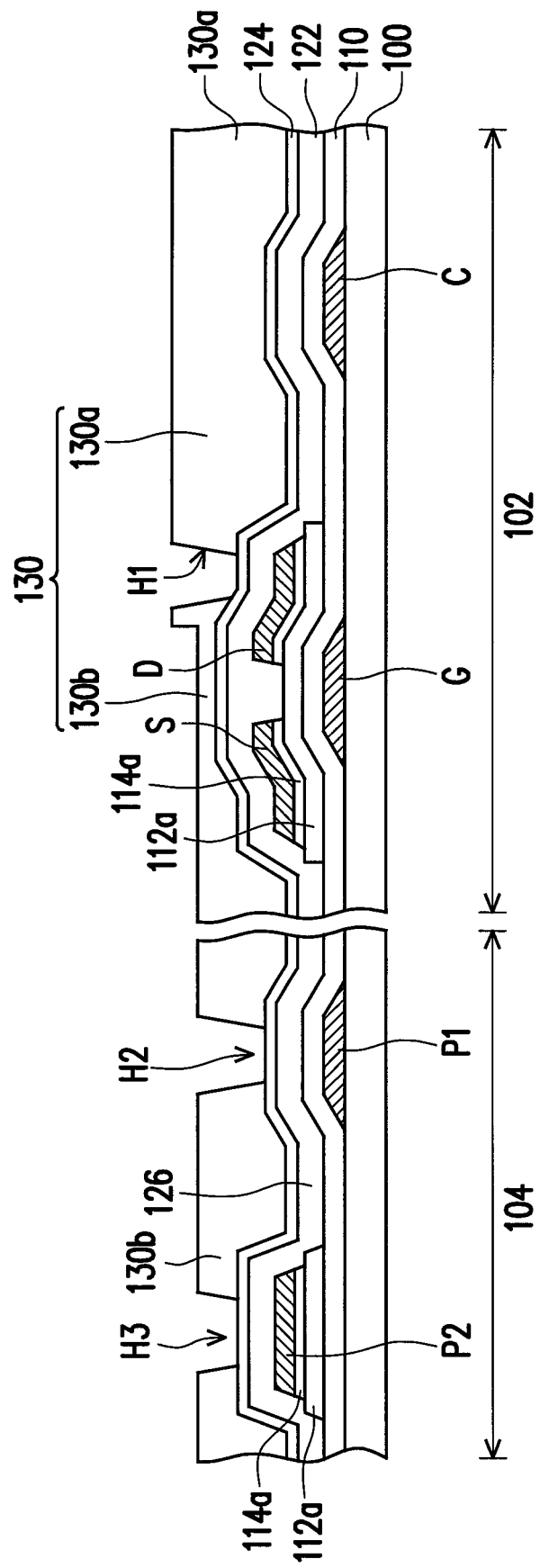
Figure 1H:
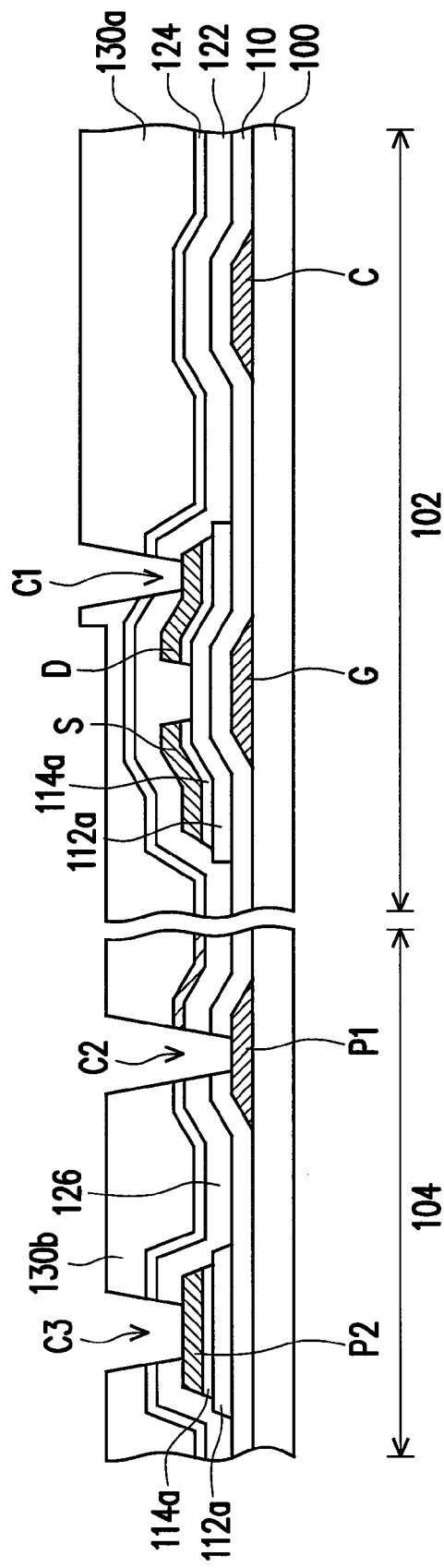
Figure 1I:
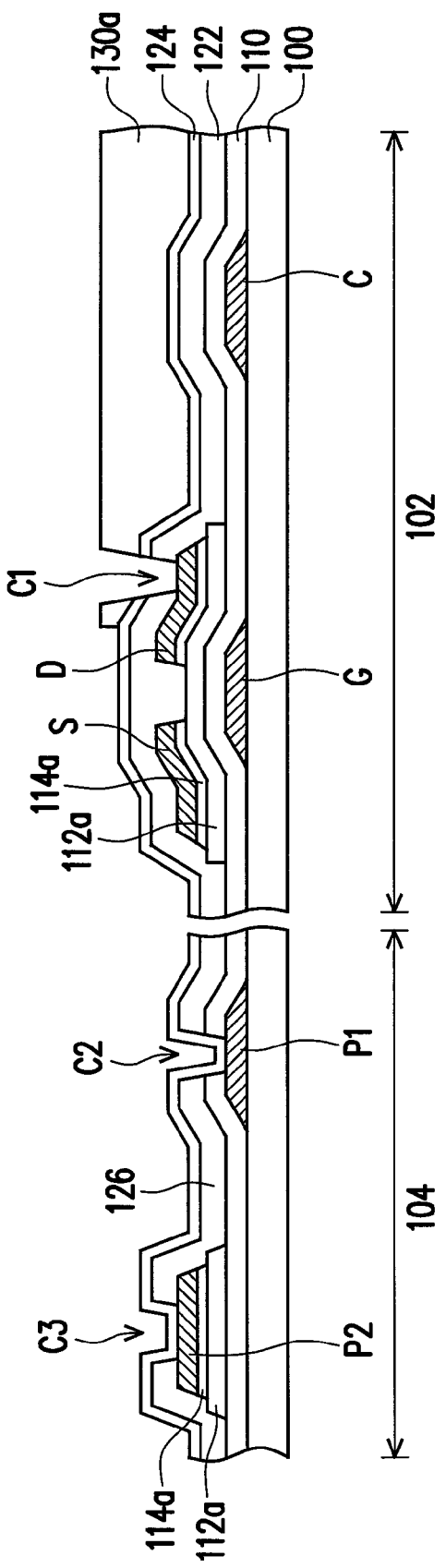
Figure 1L:
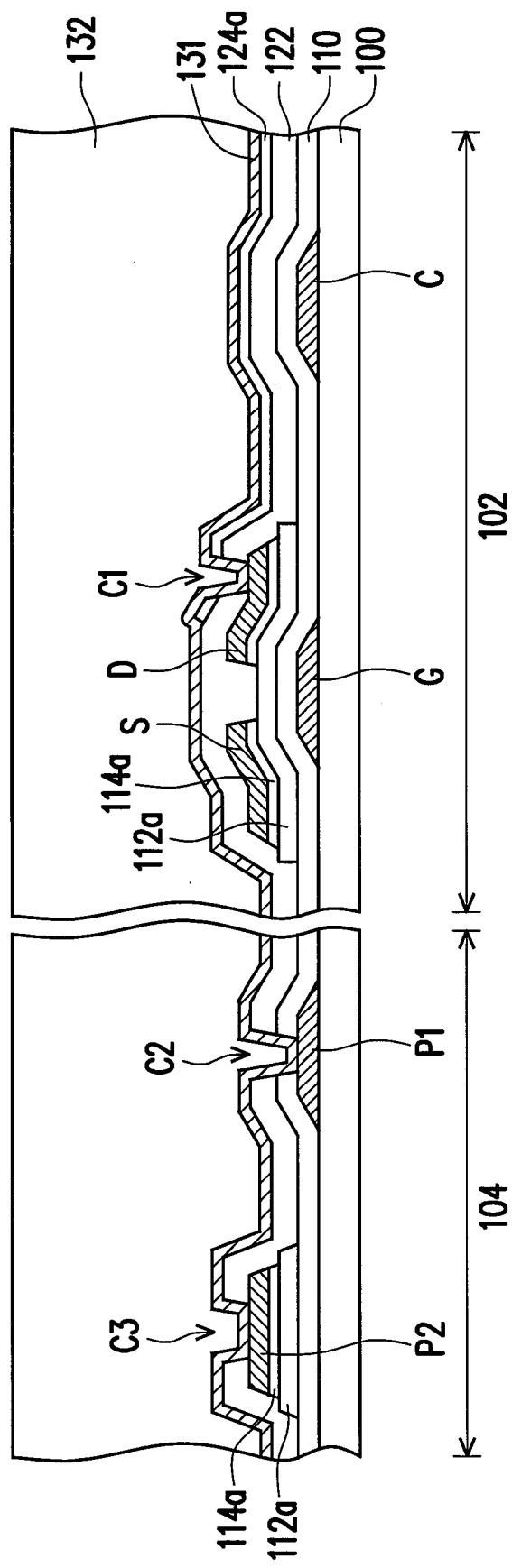
Figure 1M:
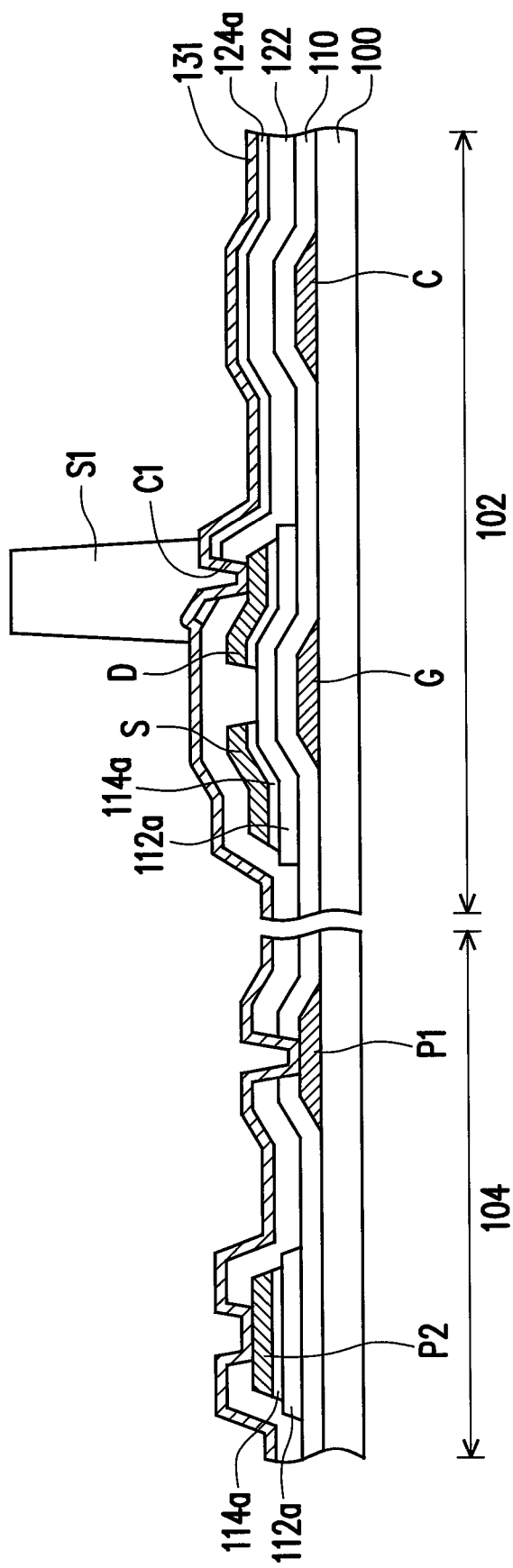
Figure 1N:
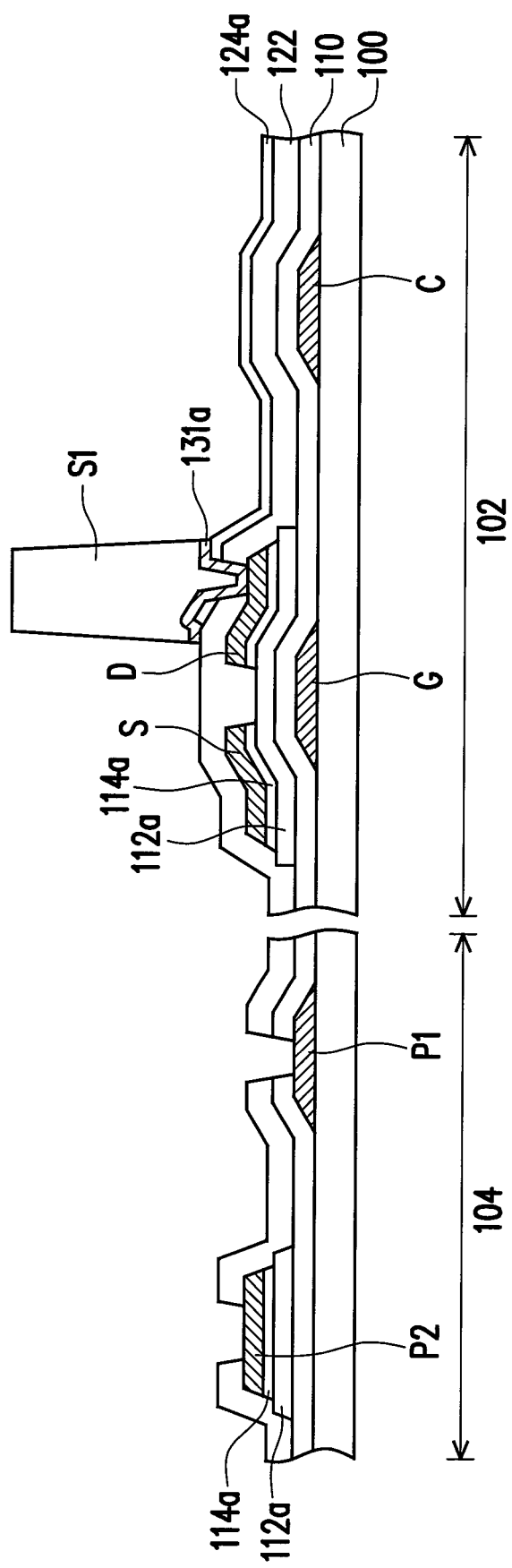

FIGS. 1A-1N are cross-section diagrams showing the fabricating flowchart of an array structure according to an embodiment of the present invention. Referring to FIG. 1A, first, a substrate 100 is provided, which has a pixel region 102 and a peripheral region 104. In more details, the drawings and the following depiction is based on one pixel region 102 as an example; however, in fact, there are a plurality of pixel regions 102 on the substrate 100. In addition, the peripheral region 104 herein is located outside all of the pixel regions 102.

Next, a gate G and a capacitor electrode C are formed in the pixel region 102 of the substrate 100 and a first conductive structure P1 is formed in the peripheral region 104 of the substrate 100. In the embodiment, the above-mentioned gate G, capacitor electrode C and first conductive structure P1 are defined by the same photomask, so that the gate G, capacitor electrode C and first conductive structure P1 are formed simultaneously and have the same material. In this regard, the gate G, capacitor electrode C and first conductive structure P1 are often termed as a first metal layer. In addition to the above-mentioned devices, the first metal layer further includes a plurality of scan lines connected to the gate G, and each scan line is extended to the peripheral region 104 and then electrically connected to one of the first conductive structures P1. The first conductive structure P1 can be pads, circuits or other devices located in the peripheral region 104. The present invention does not limit that the gate G, the capacitor electrode C and the first conductive structure P1 must be formed simultaneously. In other embodiments, the gate G, the capacitor electrode C and the first conductive structure P1 can be formed individually and the materials thereof are allowed to be different from each other.

Then, an insulating layer 110, a semiconductor layer 112 and a conductive layer 116 are sequentially formed on the substrate 100. In a preferred embodiment, prior to forming the conductive layer 116, the method further includes forming an ohmicic contacting layer 114 on the semiconductor layer 112. The material of the insulating layer 110 includes silicon oxide, silicon nitride or silicon nitride oxide, where the adopted materials mainly serve as a gate insulating layer. The material of the semiconductor layer 112 includes amorphous silicon (a-Si) or poly silicon, the material of the ohmicic contacting layer 114 includes doped a-Si and the material of the conductive layer 116 includes metal with high conductivity.

Referring to FIG. 1B, a photoresist layer 120 is formed on the conductive layer 116, wherein the photoresist layer 120 has a thicker portion 120a and a thinner portion 120b. The photoresist layer 120 is formed by, for example, conducting a lithography process by using a gray-level photomask or a halftone photomask. In particular, in the pixel region 102, the thinner portion 120b of the photoresist layer 120 is correspondingly disposed over the gate G, while the thicker portion 120a of the photoresist layer 120 is located surrounding the thinner portion 120b. In the peripheral region 104, the thicker portion 120a of the photoresist layer 120 is located nearby the first conductive structure P1, but uncovering the first conductive structure P1.

Then, the photoresist layer 120 serves as a mask to pattern the conductive layer 116, the ohmic contacting layer 114 and the semiconductor layer 112 so as to form a patterned conductive layer 116a, a patterned ohmic contacting layer 114a and a patterned semiconductor layer 112a as shown in FIG. 1C. The above-mentioned patterning process is to conduct, for example, a dry etching process or a wet etching process. In particular, the patterned conductive layer 116a formed in the peripheral region 104 is a second conductive structure P2. Similarly, the second conductive structure P2 can be pads, circuits or other devices located in the peripheral region 104.

Referring to FIG. 1D, the thinner portion 120b of the photoresist layer 120 is removed and the thicker portion 120a is remained, wherein the method to remove the thinner portion 120b of the photoresist layer 120 is to conduct an ashing process.

Then, referring to FIG. 1E, the thicker portion 120a of the photoresist layer 120 serves as a mask to remove the patterned conductive layer 116a which is uncovered by the thicker portion 120a of the photoresist layer 120 so as to define a source S and a drain D. The above-mentioned removing process is to conduct, for example, a dry etching process or a wet etching process. In particular, after forming the source S and the drain D, the fabricating method further includes removing the ohmic contacting layer 114a uncovered by the source S and the drain D, so that the semiconductor layer 112a located between the source S and the drain D is exposed. At the time, the semiconductor layer 112a can be used as a channel layer, and a TFT having the gate G, the source S and the drain D is formed in the pixel region 102.

After that, the thicker portion 120a of the photoresist layer 120 is removed, i.e., the photoresist layer 120 is removed from the substrate 100. Then, as shown in FIG. 1F, a passivation layer 122 and a pixel electrode material layer 124 are sequentially formed on the substrate 100. The material of the passivation layer 122 includes silicon nitride, silicon nitride oxide, silicon oxide or other appropriate materials and the material of the pixel electrode material layer 124 includes transparent conductive material or reflective metal material.

Then, referring to FIG. 1G, a photoresist layer 130 is formed on the pixel electrode material layer 124, wherein the photoresist layer 130 has a thicker portion 130a and a thinner portion 130b. Similarly to the mentioned above, the photoresist layer 130 is formed by, for example, conducting a lithography process by using a gray-level photomask or a halftone photomask. In the pixel region 102, the thinner portion 130b of the photoresist layer 130 is correspondingly disposed over the gate G and the source S, while the thicker portion 130a of the photoresist layer 130 covers the other region. The peripheral region 104 is covered by the thinner portion 130b of the photoresist layer 130. In particular, the photoresist layer 130 has three openings H1, H2 and H3, wherein opening H1 exposes the pixel electrode material layer 124 over the drain D, the opening H2 exposes the pixel electrode material layer 124 over the first conductive structure P1 and opening H3 exposes the pixel electrode material layer 124 over the second conductive structure P2.

Referring to FIG. 1H, the photoresist layer 130 serves as a mask to remove parts of the pixel electrode material layer 124, parts of the passivation layer 122 and parts of the insulating layer 110 so as to respectively form a contacting opening C1 exposing the drain D, a contacting opening C2 exposing the first conductive structure P1 and a contacting opening C3 exposing the second conductive structure P2. The above-mentioned removing process is to conduct, for example, a dry etching process or a wet etching process.

Then, the thinner portion 130b of the photoresist layer 130 is removed, while the thicker portion 130a is remained, as shown in FIG. 1I. Similarly to the mentioned above, the thinner portion 130b of the photoresist layer 130 is removed by conducting, for example, an ashing process. Further, the thicker portion 130a of the photoresist layer 130 serves as a mask to pattern the pixel electrode material layer 124 so as to define a pixel electrode 124a, as shown in FIG. 1J. The above-mentioned patterning process is to conduct, for example, a dry etching process or a wet etching process.

After that, as shown in FIG. 1K, the thicker portion 130a of the photoresist layer 130 is removed, i.e., the photoresist layer 130 is removed from the substrate 100 so as to expose the pixel electrode 124a. It should be noted that at the time, the pixel electrode 124a is not electrically connected to the drain D yet.

Referring to FIG. 1L, a connecting material layer 131 is formed on the substrate 100. The connecting material layer 131 overlays the pixel electrode 124a, and further, a spacer material layer 132 is formed on the connecting material layer 131. In particular, the connecting material layer 131 directly contacts the pixel electrode 124a and fills into the contacting openings C1, C2 and C3 so as to respectively electrically connect the drain D, the first conductive structure P1 and the second conductive structure P2. The material of the connecting material layer 131 includes conductive material such as metal or transparent metal oxide, and the material of the spacer material layer 132 is, for example, organic photosensitive material.

Then, a lithography process to the spacer material layer 132 is conducted to form a first spacer S1, as shown in FIG. 1M. The first spacer S1 is located on the connecting material layer 131 over the contacting opening C1.

Referring to FIG. 1N, the first spacer S1 serves as a mask to remove the connecting material layer 131 uncovered by the first spacer S1 so as to form a first connecting layer 131a. The above-mentioned removing process is to conduct, for example, a dry etching process or a wet etching process. At the time, since the first connecting layer 131a fills into the contacting opening C1 to electrically contact the drain D and the first connecting layer 131a is electrically connected to the pixel electrode 124a already, so that the pixel electrode 124a is electrically connected to the drain D via the first connecting layer 131a.

The array structure fabricated with the above-mentioned method is shown by FIG. 1N and includes the TFT having the gate G, the source S and the drain D, the passivation layer 122, the pixel electrode 124a, the first connecting layer 131a and the first spacer S1. The passivation layer 122 overlays the TFT. The pixel electrode 124a is located on the passivation layer 122. The pixel electrode 124a and the passivation layer 122 have a contacting opening C1 therein to expose the drain D. The first connecting layer 131a is located in the contacting opening C1 and electrically connected to the pixel electrode 124a and the drain D. The first spacer S1 is located at the contacting opening C1 and covers the first connecting layer 131a. It should be noted that the first connecting layer 131a is defined by the first spacer S1 serving as an etching mask, therefore, the first spacer S1 and the first connecting layer 131a have the same pattern profile.

Figure 2:
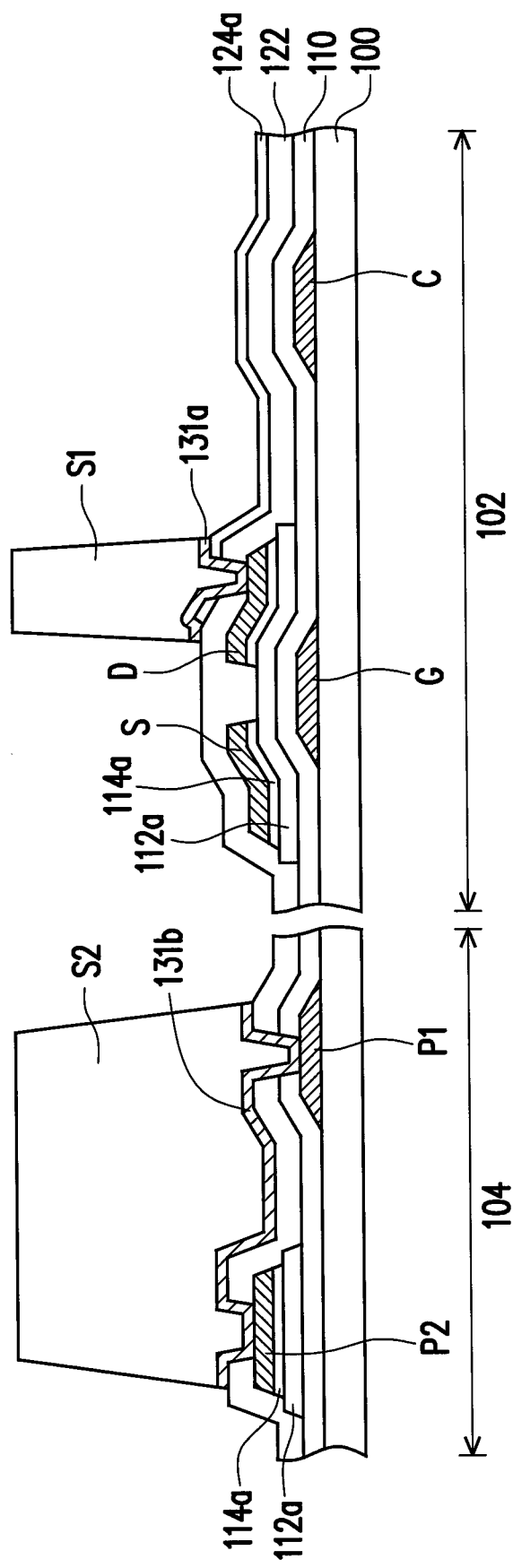
FIG. 2 is a cross-section diagram showing an array structure according to another embodiment of the present invention.

In the array structure of the above-mentioned embodiment shown by FIG. 1N, the first spacer S1 is disposed at the contacting opening over the TFT. However in other embodiments, it is allowed to dispose a second spacer in the peripheral region 104. Referring to FIG. 2, it is similar to the embodiment shown by FIG. 1N except that there is a second spacer S2 disposed in the peripheral region 104, and the second spacer S2 is located at the contacting openings C2 and C3. Moreover, there is a second connecting layer 131b disposed between the second spacer S2 and the first conductive structure P1 and second conductive structure P2, where the first conductive structure P1 and the second conductive structure P2 are electrically connected to each other through the second connecting layer 131b, the contacting opening C2 and the contacting opening C3. Under the above-mentioned electrical connections, the first conductive structure P1, the second conductive structure P2 and the second connecting layer 131b in the embodiment of FIG. 2 together comprise a turn-line structure.

In the embodiment of FIG. 2, the second connecting layer 131b and the first connecting layer 131a are formed simultaneously, and the second spacer S2 and the first spacer S1 are formed simultaneously as well. In more details, the fabricating method of array structures in the embodiment of FIG. 2 includes the steps described from FIG. 1A to FIG. 1L. Then, during conducting the lithography process shown by FIG. 1L, the step further includes forming the second spacer S2 in the peripheral region 104 in addition to forming the first spacer S1 in the pixel region 102. Then, during conducting the removing process shown by FIG. 1M, the step includes remaining the connecting material layer 131 under the first spacer S1 to form the first connecting layer 131a and further includes remaining the connecting material layer 131 under the second spacer S2 to form the second connecting layer 131b so as to complete the array structure as shown in FIG. 2. Similarly to the mentioned above, since the second connecting layer 131b is defined by the second spacer S2 serving as the etching mask, so that the second spacer S2 and the second connecting layer 131b have the same pattern profile.

Figure 3:
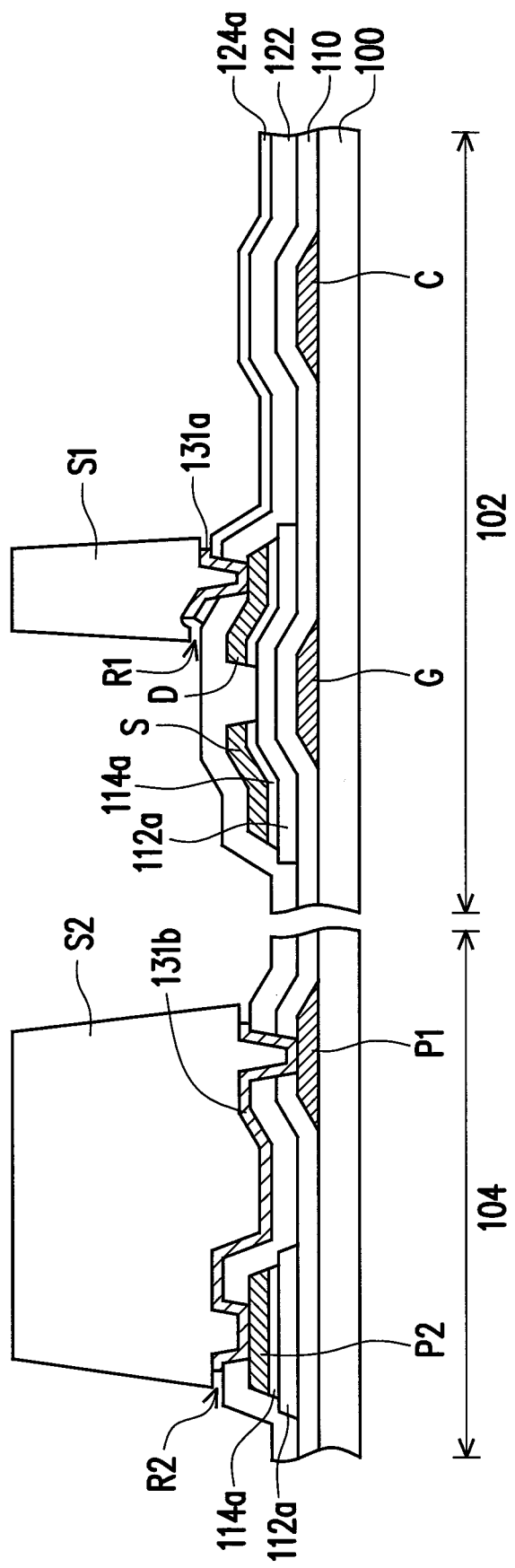
FIG. 3 is a cross-section diagram showing an array structure according to yet another embodiment of the present invention.

FIG. 3 is a cross-section diagram showing the fabricating flowchart of an array structure according to yet another embodiment of the present invention. Referring to FIG. 3, the array structure of FIG. 3 is similar to the one of FIG. 1 or FIG. 2 except that after forming the first spacer S1 and the first connecting layer 131a, the method further includes conducting a side etching process to the first connecting layer 131a so as to form a cavity structure R1 between the first spacer S1 and the first connecting layer 131a. In more details, the cavity structure R1 is located surrounding the bottom of the first spacer S1. Similarly to the mentioned above, if the second spacer S2 and the second connecting layer 131b are formed in the peripheral region 104, the method further includes conducting a side etching process to the second connecting layer 131b so as to form a cavity structure R2 between the second spacer S2 and the second connecting layer 131b. In more details, the cavity structure R2 is located surrounding the bottom of the second spacer S2. It should be noted that the side etching process on the first connecting layer 131a and the side etching process on the second connecting layer 131b can be conducted simultaneously. The steps of forming the cavity structure R1 and the cavity structure R2 largely reduce producing probability of fault-conducting between the first connecting layer 131a and second connecting layer 131b and other circuits. In more details, in some embodiments, the turn-line structure of the peripheral region 104, as depicted in FIGS. 2 and 3, can be disposed in a sealant region, where a plurality of golden balls are usually disposed to make the upper substrate and the lower substrate electrically connected to each other. Therefore, if the cavity structure R2 is formed at the bottom of the second spacer S2 over the turn-line structure, the producing probability of fault-conducting of the second connecting layer 131b and the golden balls is largely reduced.

In summary, the present invention features that the spacers is integrated into the fabrication process of the array structures, and the provided fabrication process does not increase the photomask quantity required by fabricating the original array structures. In other words, the fabricating method of the present invention can save the photomask for forming the spacers in the conventional fabrication process of the color filter substrate. As a result, the present invention is advantageous in reducing the number of the employed photomasks to reduce the fabricating cost. In more details, since the pixel electrodes and the contacting openings are integrated into a same process and fabricated by using the same photomask, and the photomask for forming the spacers in the conventional fabrication process of the color filter substrate is saved, so that the present invention can achieve the goal of reducing the total number of the employed photomasks.

On the other hand, in the present invention, the connecting layers for electrically connecting the pixel electrodes and the drains are defined by the spacers serving as an etching mask, therefore, the spacers are located at the contacting openings over the TFTs, i.e., located in the nontransparent regions of the array structures. Under the above-mentioned disposing, the positions where the spacers are disposed would not affect the aperture ratio of the array structures. As a result, there is no need in the present invention to conduct a modification design on the spacer structure to compensate the loss of the aperture ratio.

It will be apparent to those skilled in the art that the descriptions above are several preferred embodiments of the present invention only, which does not limit the implementing range of the present invention. In view of the foregoing, it is intended that the present invention covers modifications and variations of this invention provided they fall within the scope of the following claims and their equivalents.

What is claimed is:

1. A fabricating method of an array structure, comprising:
   forming a thin film transistor comprising a gate, a source and a drain, wherein the method of forming the thin film transistor comprises:
   forming the gate;
   sequentially forming an insulating layer, a semiconductor layer and a conductive layer to overlay the gate;
   forming a photoresist layer on the conductive layer, wherein the photoresist layer has a thinner portion and a thicker portion, the thinner portion is correspondingly disposed on the conductive layer over the gate;
   patterning the conductive layer and the semiconductor layer by using the photoresist layer as a mask;
   removing the thinner portion of the photoresist layer and keeping the thicker portion;
   removing the conductive layer which is not covered by the thicker portion by using the thicker portion of the photoresist layer as a mask, so as to define a source and a drain; and
   removing the thicker portion of the photoresist layer;
   sequentially forming a passivation layer and a pixel electrode material layer, overlaying the thin film transistor;
   forming a first contacting opening in the pixel electrode material layer and the passivation layer to expose the drain;
   patterning the pixel electrode material layer to define a pixel electrode;
   forming a connecting material layer, overlaying the pixel electrode and filling into the first contacting opening;
   forming a first spacer on the connecting material layer, wherein the first spacer is correspondingly disposed over the first contacting opening; and
   forming a first connecting layer by using the first spacer as a mask to remove the connecting material layer which is not covered by the first spacer, and the pixel electrode is electrically connected to the drain through the first connecting layer.

2. The fabricating method of an array structure as claimed in claim 1, wherein the method of forming the first contacting opening and defining the pixel electrode comprises:
   forming a photoresist layer on the pixel electrode material layer to expose the pixel electrode material layer over the drain, wherein the photoresist layer has a thinner portion and a thicker portion, and the thinner portion is correspondingly disposed over the gate and the source;
   removing a portion of the pixel electrode material layer and a portion of the passivation layer by using the photoresist layer as a mask, so as to form the first contacting opening exposing the drain;
   removing the thinner portion of the photoresist layer;
   patterning the pixel electrode material layer by using the thicker portion of the photoresist layer as a mask to define the pixel electrode; and
   removing the thicker portion of the photoresist layer.

3. The fabricating method of an array structure as claimed in claim 1, wherein after removing the connecting material layer which is not covered by the first spacer to form the first connecting layer, the fabricating method further comprises conducting a side etching process to the first connecting layer.

4. The fabricating method of an array structure as claimed in claim 1, further comprising:
   forming a first conductive structure, an insulating layer overlaying the first conductive structure, and a second conductive structure on the insulating layer on the substrate, wherein the passivation layer overlays the second conductive structure;
   forming a second contacting opening in the passivation layer and the insulating layer to expose the first conductive structure, and forming a third contacting opening in the passivation layer to expose the second conductive structure;
   filling the connecting material layer into the second contacting opening and the third contacting opening;
   forming a second spacer on the connecting material layer, wherein the second spacer is correspondingly disposed over the second contacting opening and the third contacting opening; and
   removing the connecting material layer which is not covered by the second spacer by using the second spacer as a mask so as to form a second connecting layer, and the first conductive structure is electrically connected to the second conductive structure through the second connecting layer.

5. The fabricating method of an array structure as claimed in claim 4, wherein after removing the connecting material layer which is not covered by the second spacer to form the second connecting layer, the fabricating method further comprises conducting a side etching process to the second connecting layer.

6. The fabricating method of an array structure as claimed in claim 4, wherein the first contacting opening, the second contacting opening and the third contacting opening are formed simultaneously.

7. The fabricating method of an array structure as claimed in claim 4, wherein the first spacer and the second spacer are formed simultaneously.

8. The fabricating method of an array structure as claimed in claim 4, wherein the step of removing the connecting material layer which is not covered by the first spacer and the step of removing the connecting material layer which is not covered by the second spacer are conducted simultaneously.

9. The fabricating method of an array structure as claimed in claim 4, wherein the first conductive structure and the gate of the thin film transistor are formed simultaneously.

10. The fabricating method of an array structure as claimed in claim 4, wherein the second conductive structure and the source and drain of the thin film transistor are formed simultaneously.

* * * * *